United States Patent [19]

Kuba

[11] Patent Number: 4,739,451
[45] Date of Patent: Apr. 19, 1988

[54] MODULARLY EXPANDABLE DESKTOP KEYBOARD

[75] Inventor: Lawrence M. Kuba, Nashua, N.H.

[73] Assignee: Wang Laboratories, Inc., Lowell, Mass.

[21] Appl. No.: 948,280

[22] Filed: Dec. 31, 1986

[51] Int. Cl.$^4$ .............................................. H05K 5/02
[52] U.S. Cl. ................................ 361/394; 361/380
[58] Field of Search ............... 339/17 M, 17 N, 75 R, 339/75 M, 91 R; 361/384, 392–395, 399, 380, 407

[56] References Cited

U.S. PATENT DOCUMENTS

| | | | |
|---|---|---|---|
| 4,401,351 | 8/1983 | Record | 339/17 M |
| 4,501,460 | 2/1985 | Sisler | 339/91 R |
| 4,558,914 | 12/1985 | Prager et al. | 361/413 |

FOREIGN PATENT DOCUMENTS 0178800  4/1986  European Pat. Off. ............ 361/394

Primary Examiner—A. D. Pellinen
Assistant Examiner—Gregory D. Thompson
Attorney, Agent, or Firm—Michael H. Shanahan

[57] ABSTRACT

A modularly expandable keyboard has expansion modules which are integrated into an elementary keyboard by locking tongues inserted in depressed tracks in the modules and held in place by detents in the attached modules. The detent mechanisms are formed integrally with the housings of the modules and are unstressed when fully engaged. An electrical interconnect plug integrates the electrical busses of attached modules. Modules can be attached to either right or left and additional modules can be attached to already attached modules indefinitely.

11 Claims, 2 Drawing Sheets

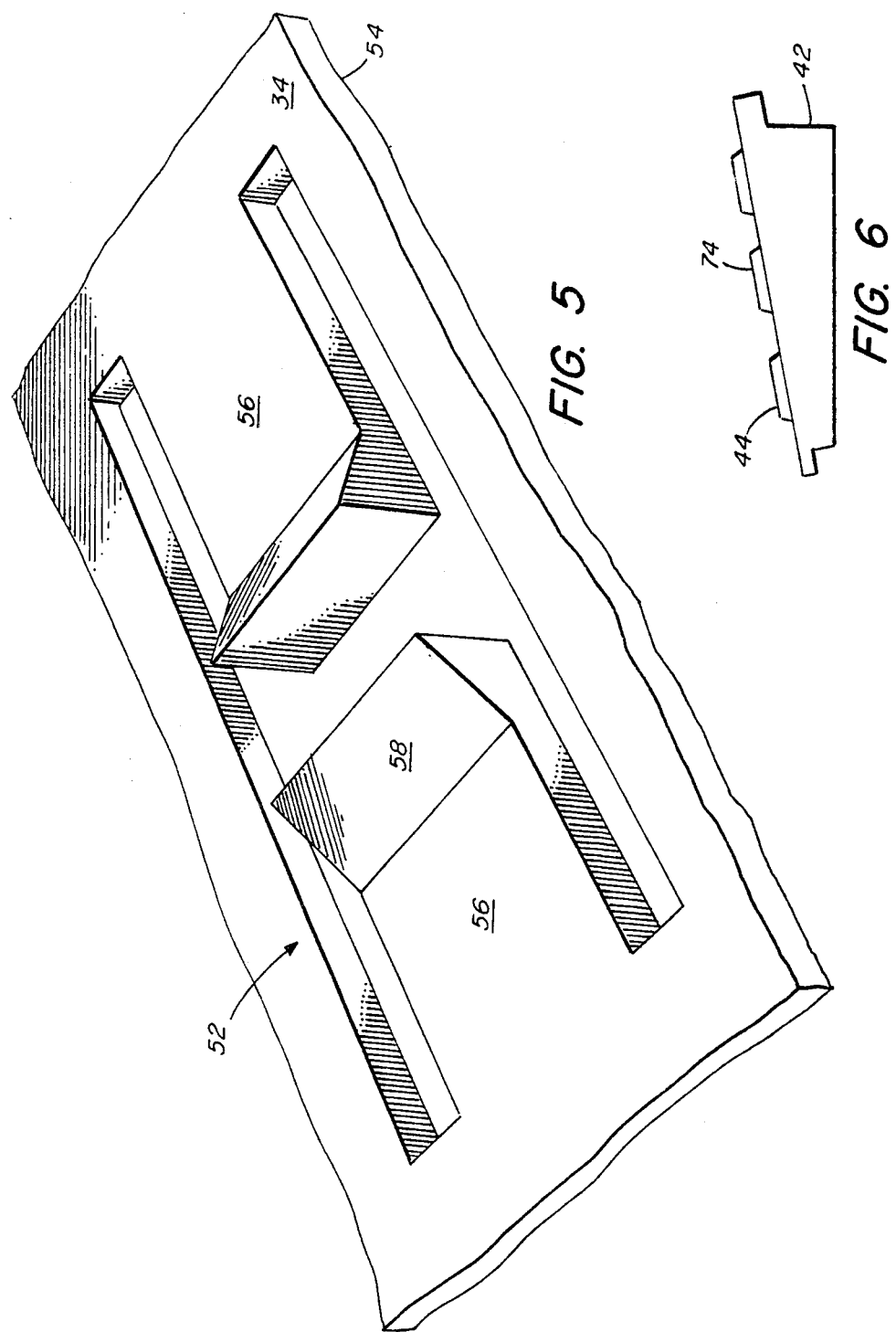

MODULARLY EXPANDABLE DESKTOP KEYBOARD

BRIEF SUMMARY OF THE INVENTION

This invention relates to desktop keyboards and auxiliary devices such as voice pick up devices, speakers, and numerical keypads, which are used by an operator to control and interact with a computer. Computers are often offered to users with a choice of various auxiliary devices in addition to a simple keyboard, which must be accommodated on the desk of the operator. At the same time the space on an operator's desk is in high demand for many things. This invention provides a operator control board which can be modularly expanded from a minimal keyboard by adding auxiliary modules such as a numerical keypad or telephone. The added modules are mechanically and electrically integrated into an expanded control board with flexibility as to the configuration of positioning the modules with respect to each other. The modular arrangement is further advantageous in using no unnecessary desk space.

BRIEF DESCRIPTION OF THE DRAWINGS

FIG. 5 shows a detail of the detent mechanism used in the board of FIG. 1.

FIG. 6 shows an end view of the tongue which is an element of the board of FIG. 1.

DETAILED DESCRIPTION

Figure 1:
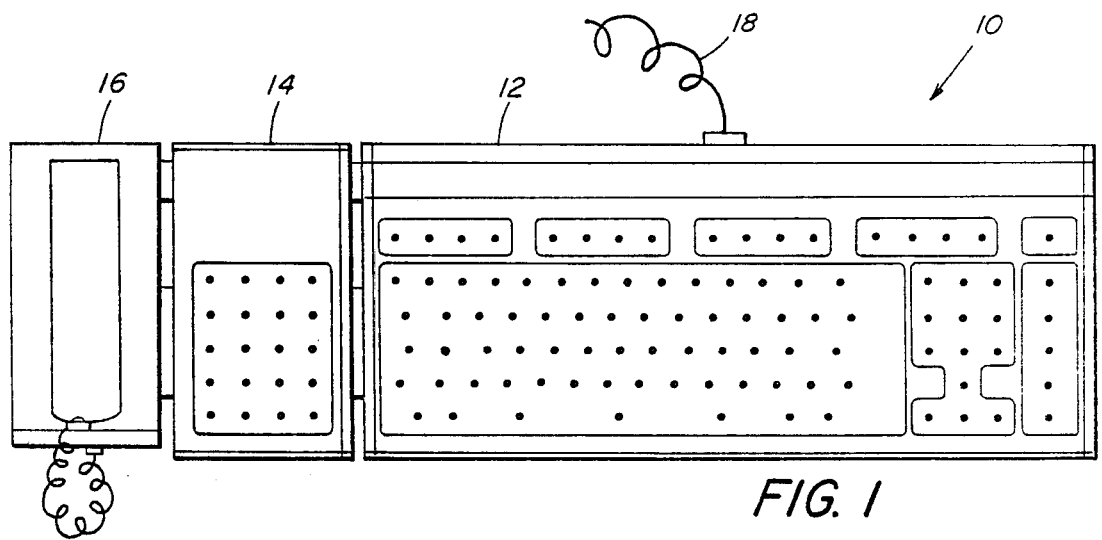
FIG. 1 shows a modularly expandable desktop interaction board according to the invention.
Figure 2:
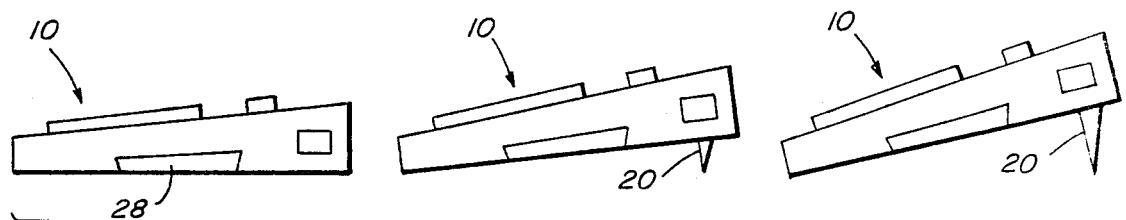
FIG. 2 shows the board of FIG. 1 set at three slopes, as seen from the right end.

A modularly expandable desktop interaction board 10 according to the invention is shown in FIG. 1, and includes keyboard module 12, keypad module 14, and telephone module 16, which are shown as exemplary of a generic expansion module. Board 10 is interconnected to a host computer through connector 18. The modules 12, 14, 16 have a common side profile, and all have a set of adjustable rear supports 20 which permit all modules to be tipped up to position their top surfaces at a common set of slopes, as shown particularly in FIG. 2.

Figure 3:
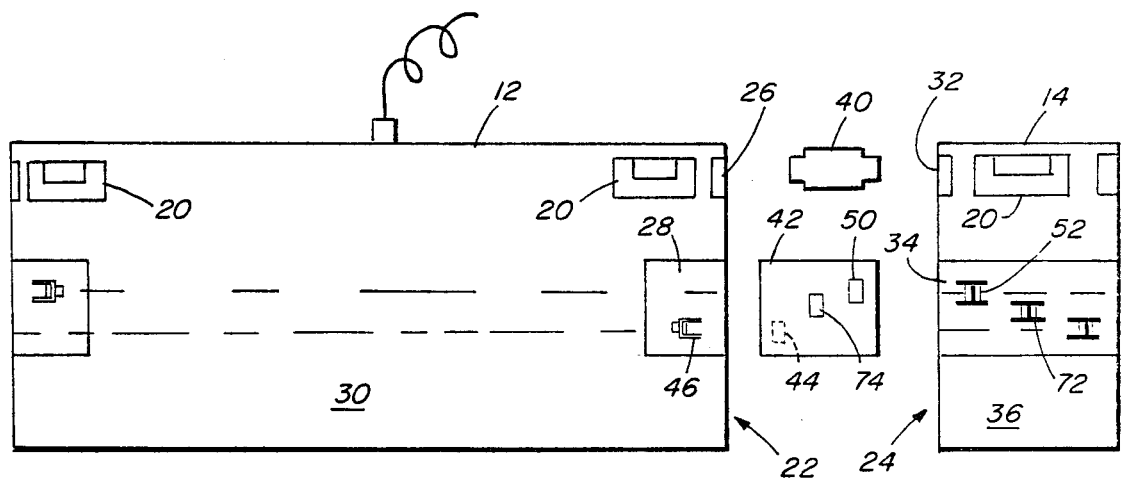
FIG. 3 shows the bottom of the board of FIG. 1 with elements separated from each other.

Keyboard module 12 has attachment interface 22 situated generaly at its left side, and expansion module 14 has attachment interface 24 situated generally at its right side as shown particularly in the bottom view of FIG. 3. (The terms right and left are referred to the top view throughout this document.)

Keyboard interface 22 includes electrical socket 26 connecting with an electrical bus (not illustrated) interior to keyboard module 12. Keyboard interface 22 also includes track 28 depressed below bottom surface 30 of module 12.

Expansion interface 24 includes electrical socket 32 connecting with an electrical bus (not illustrated) interior to expansion module 14. Expansion interface 24 also includes track 34 depressed below bottom surface 36 of module 14. As shown in the pulled-apart illustration of FIG. 3, the electrical sockets and tracks are aligned when the modules are placed side by side with a common profile.

Figure 4:
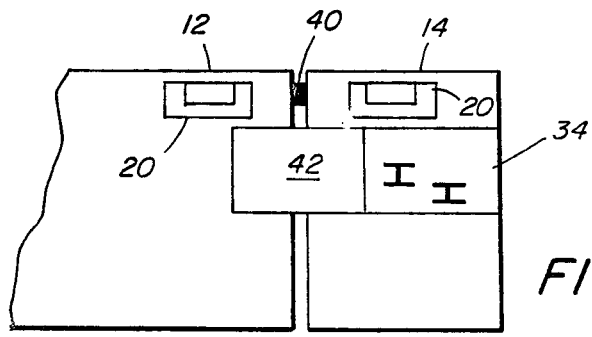
FIG. 4 shows a detail of the board of FIG. 1.

Bridging tongue 42 slides into both tracks 28 and 34 when modules 12 and 14 are integrated as shown particularly in the bottom view of FIG. 4. Tongue 42 fits snugly in edges of tracks 28 and 32, and the tracks and tongue have a depth (referring to the direction towards and away from the operator in the normal operating position) that is an appreciable fraction of that of the boards to provide, when in place, a rigid coupling between modules and thus form a mechanically integrated expanded keyboard unit. Tongue 42 is maintained in position in keyboard track 28 by engagement of male detent element 44 on tongue 42 with female detent element 46 on track 28. Similarly tongue 42 is maintained in position in track 34 by engagement of male detent element 50 on tongue 42 with female detent element 52 on track 34.

Female detent element 52 shown more particularly in FIG. 5 is advantageously molded as an integral part of the polymeric housing 54 of the module. Female detent element 52 (as exemplary) includes cantilevered spring 56 supporting wedge 58, which protrudes above track 34. Male detent element 44 (as exemplary) is a bump molded integrally as a part of polymeric tongue 42. The positions of the engaging elements of the detent are such that the spring of the female element is stressed in flexure only while the male element is entering or exiting the detented position. This arrangement avoids giving the polymeric material of the spring a permanent set from remaining in a stressed condition for extended periods.

Electrical interconnector 40 is advantageously a rigid double-ended electrical plug which fits simultaneously into sockets 26 and 32, and is dimensioned to be seated in both sockets when modules 12 and 14 are mechanically integrated to form an integrated electrical bus extending through both of the integrated modules.

The foregoing discussion has been described the attachment of an expansion module to the left side of the keyboard as exemplary. Corresponding electrical and mechanical structures are provided for attachment of an expansion module to the right side of the keyboard module and for attachment of an additional expansion module outboard of any attached expansion module.

As shown particularly in FIGS. 3 and 6, an additional detent with male element 74 on tongue 42 and female element 72 in track 34 of an expansion module provides a stable storage place for a tongue in a module track when not in use. The detents used for leftward expansion, those used for rightward expansion, and those used for storage are positioned on distinct alignments to avoid interference. The slopes of the wedges 58 and the protuberances 44 are adjusted so that the engagement of a detent requires less force than that required for disengaging. This arrangement ensures that when a tongue has been engaged in a module and is protruding (say) to the right and is then slid into the left facing interface of another module the tongue will engage with the module on the right in preference to disengagement from the detented position in the left module.

What is claimed is:

1. A modularly expandable desktop interaction board for use by an operator to interact with a computer including a keyboard module, an expansion module, a briding tongue, and an electrical interconnector, all of said modules having a common side profile, each of said modules being adjustable to provide a set of slope values for its top surface, the set of slope values being identical for all modules, each of said modules having an attachment interface including a track depressed from its bottom surface, said track admitting said briding tongue by a sliding motion in the right-left direction, said tracks being uniformly positioned on the modules to effect alignment of tracks of modules placed side by side, means for maintaining the briding tongue in a position partly inserted into the track of said keyboard module and partly inserted into the track of the expansion module placed adjacent thereto so as to lock said keyboard module and said expansion module together to form a mechanically integrated expanded keyboard unit, and means for electrically interconnecting said modules through said electrical interconnector.

2. A modularly expandable desktop interaction board as claimed in claim 1, said keyboard module having a polymeric housing, including a detent mechanism for attaching said briding tongue to said keyboard module, said detent mechanism including a protuberance affixed to said tongue and protruding toward the track of said keyboard module when said tongue is inserted therein and a cantilevered spring integral with the housing of the keyboard module and supporting a wedge protruding above the track, said protuberance, spring, and wedge being constructed and positioned so that as the tongue is inserted into the track of the keyboard module, the protuberance engages the wedge, thereby flexing the spring, then passes over the wedge into a stable detent position, the spring being unflexed when the protuberance is in the stable detent position.

3. A modularly expandable desktop interaction board as claimed in claim 2, wherein said expansion module can be attached to either end of said keyboard module.

4. A modularly expandable desktop interaction board as claimed in claim 2, wherein said tongue has a depth that is sufficient to provide rigid coupling between modules.

5. A modularly expandable desktop interaction board as claimed in claim 1, wherein said expansion module when attached to said keyboard module provides an attachment interface equivalent to that of the interface to which it is attached for attachment thereto of a second expansion module.

6. A modularly expandable desktop interaction board as claimed in claim 2, wherein said expansion module when attached to said keyboard module provides an attachment interface equivalent to that of the interface to which it is attached for attachment thereto of a second expansion module.

7. A modularly expandable desktop interaction board as claimed in claim 3, wherein said expansion module when attached to said keyboard module provides an attachment interface equivalent to that of the interface to which it is attached for attachment thereto of a second expansion module.

8. A modularly expandable desktop interaction board as claimed in claim 4, wherein said expansion module when attached to said keyboard module provides an attachment interface equivalent to that of the interface to which it is attached for attachment thereto of a second expansion module.

9. A attachment module for attachment to a modularly expandable desktop interaction board, said module having an attachment interface including a track depressed from its bottom surface and an electrical interconnection socket, said track admitting a bridging tongue by a sliding motion in the right-left direction, said track being position on the module effect alignment of said track with a track of a tracked interaction board placed therebeside, means for maintaining a bridging tongue in a position partly inserted into said track and protruding into a track of an interaction board placed adjacent thereto so as to lock said module to said adjacent placed interaction board to form a mechanically integrated expanded keyboard unit.

10. A module as claimed in claim 9, includes a further means for maintaining said tongue in a storage position in said module track.

11. A module as claimed in claim 10, wherein said means for maintaining requires greater force to disengage than to engage.

* * * * *